United States Patent [19]
Grunfeld

[11] Patent Number: 5,847,366
[45] Date of Patent: Dec. 8, 1998

[54] APPARATUS AND METHOD FOR CONTROLLING THE TEMPERATURE OF AN INTEGRATED CIRCUIT UNDER TEST

[75] Inventor: David R. Grunfeld, Tempe, Ariz.

[73] Assignee: Intel Corporation, Santa Clara, Calif.

[21] Appl. No.: 668,045

[22] Filed: Jun. 18, 1996

[51] Int. Cl.⁶ .................................................. H05B 1/02
[52] U.S. Cl. .................... 219/497; 219/494; 165/80.4; 437/248
[58] Field of Search ............................... 219/497, 494, 219/501; 156/345; 118/724, 728; 165/80.4, 80.5, 80.2; 437/248

[56] References Cited

U.S. PATENT DOCUMENTS

| | | | |
|---|---|---|---|
| 4,138,692 | 2/1979 | Meeker et al. | 357/82 |
| 4,297,190 | 10/1981 | Garrett | 204/192 |
| 4,527,620 | 7/1985 | Pedersen et al. | 165/80 D |
| 5,050,036 | 9/1991 | Oudick et al. | 361/385 |
| 5,593,509 | 1/1997 | Zuppero et al. | 136/253 |

*Primary Examiner*—Mark H. Paschall
*Attorney, Agent, or Firm*—Blakely, Sokoloff, Taylor & Zafman

[57] ABSTRACT

The present invention is an apparatus and method for controlling the temperature of a heat generating device. The invention is particularly adaptable to controlling the temperature of an integrated circuit under test. In one embodiment the invention involves the use of a bellows having a heat slug disposed at one end that is adapted to engage a surface of the heat generating device. The bellows is compliant and includes a cavity containing a heat transfer medium. The bellows cavity is in fluid communication with a heat transfer medium reservoir. Heat is transferred from the heat generating device by engaging the heat slug with a surface of the heat generating device and applying a force to the bellows. The compliant nature of the bellows provides the temperature control apparatus with a self-planarizing feature that maximizes the contact surface area between the heat slug and heat generating device.

29 Claims, 8 Drawing Sheets

APPARATUS AND METHOD FOR CONTROLLING THE TEMPERATURE OF AN INTEGRATED CIRCUIT UNDER TEST

FIELD OF THE INVENTION

The present invention relates to a method and apparatus for removing heat from the surface of a workpiece, and, more particularly, to removing heat from the surface of an integrated circuit die or package during the functionality and/or performance testing of the device.

BACKGROUND OF THE INVENTION

Integrated circuits are typically housed within a package that is mounted to a printed circuit board (PCB). The package is designed to protect the integrated circuit device from damage, to provide adequate heat dissipation during operation, and to provide electrical connection between the integrated circuit device and a PCB (e.g., a peripheral card, a motherboard and the like). These conventional packages may include a variety of packages such as pin grid array (PGA), land grid array (LGA), ball grid array (BGA), column grid array (CGA), and other packages. As a part of the manufacturing process, integrated circuits typically undergo a variety of functional tests. The present invention is aimed at removing heat from the surface of an integrated circuit that is housed within a LGA package during the environmental testing of the integrated circuit device. The environmental test is performed before a package is mounted to a printed circuit board. The purpose of the test is to check the functionality and to monitor the electrical performance of the integrated circuit. The environmental test is generally performed within a temperature controlled chamber. A vacuum pick-up chuck is typically used to position the LGA package within the chamber. The electrical testing of the integrated circuit is performed by positioning the LGA package within the chamber such that the package land array is in electrical contact with a corresponding pogo pin or contact array located on the contactor/load board of the test apparatus. Information pertaining to the electrical performance of the device is gathered during the test. The information is then used to separate the good integrated circuits from the bad and to separate the integrated circuits according to their operating frequency. This process is commonly referred to as "binning out."

It is commonly known that as the temperature of an integrated circuit rises, the frequency at which the device operates decreases. Therefore, it is important to control the temperature of the integrated circuit during the environmental test to ensure that the device is appropriately separated or "binned" according to its operating frequency. It is also important to control the temperature of the integrated circuit since excessive temperatures may affect the performance of the circuit and cause permanent degradation of the device. In addition, it is desirable to hold the temperature of the integrated circuit device at a relatively constant temperature throughout the testing sequence.

The traditional method for cooling integrated devices has been through convection heat transfer. Using this method, heat is dissipated from the integrated circuit through the outer surfaces of the device into still or moving air. As the integration level (i.e., the number of transistors per device) of integrated circuits increases, or the power requirements or the operating speed of integrated circuits increases, the amount of heat generated by these devices increases to a point where conventional convection solutions are inadequate. Although "active" heat removal methods, such as heat pump and heat pipe systems, have been developed to cool these high heat dissipating devices within their normal operating environments, there exists a need to provide a method for cooling the integrated circuits during the environmental testing of the devices. If the integrated circuit device is not adequately cooled during the test, and is permitted to rise significantly above a designated test temperature, the device may be unnecessarily down-graded into a lower frequency bin. It is also important that the temperature of the integrated circuit device be maintained above the designated test temperature during the environmental test process in order to ensure that the device is not improperly upgraded into a higher frequency bin.

Thus, what is needed is a method and apparatus for controlling the temperature of an integrated circuit device that solves the problems associated with testing an integrated circuit package.

SUMMARY OF THE INVENTION

The present invention is an apparatus and method for controlling the temperature of a heat generating device. The invention is particularly adaptable to controlling the temperature of an integrated circuit during the functionality and/or performance testing of the device. In one embodiment the invention involves the use of a bellows having a heat slug disposed at an end of the bellows that is adapted to engage a surface of the heat generating device. The bellows is compliant and includes a cavity containing a heat transfer medium. The bellows cavity is in fluid communication with a heat transfer medium reservoir. Heat is transferred from the heat generating device by engaging the heat slug with a surface of the heat generating device and applying a force to the bellows. The compliant nature of the bellows provides the temperature control apparatus with a self-planarizing feature that maximizes the contact surface area between the heat slug and heat generating device.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus and method for cooling a heat generating device is described. In the following description, numerous specific details are set forth such as material types, dimensions, etc., in order to provide a thorough understanding of the present invention. However, it will be obvious to one of skill in the art that the invention may be practiced without these specific details. In other instances, well known elements have not been shown in particular detail in order to avoid unnecessarily obscuring the present invention. It is important to note that this discussion will mainly be limited to those needs associated with controlling the temperature of an integrated circuit device. It will be recognized, however, that such focus is for descriptive purposes only and that the apparatus and methods of the present invention may be applied to other applications.

Figure 1:
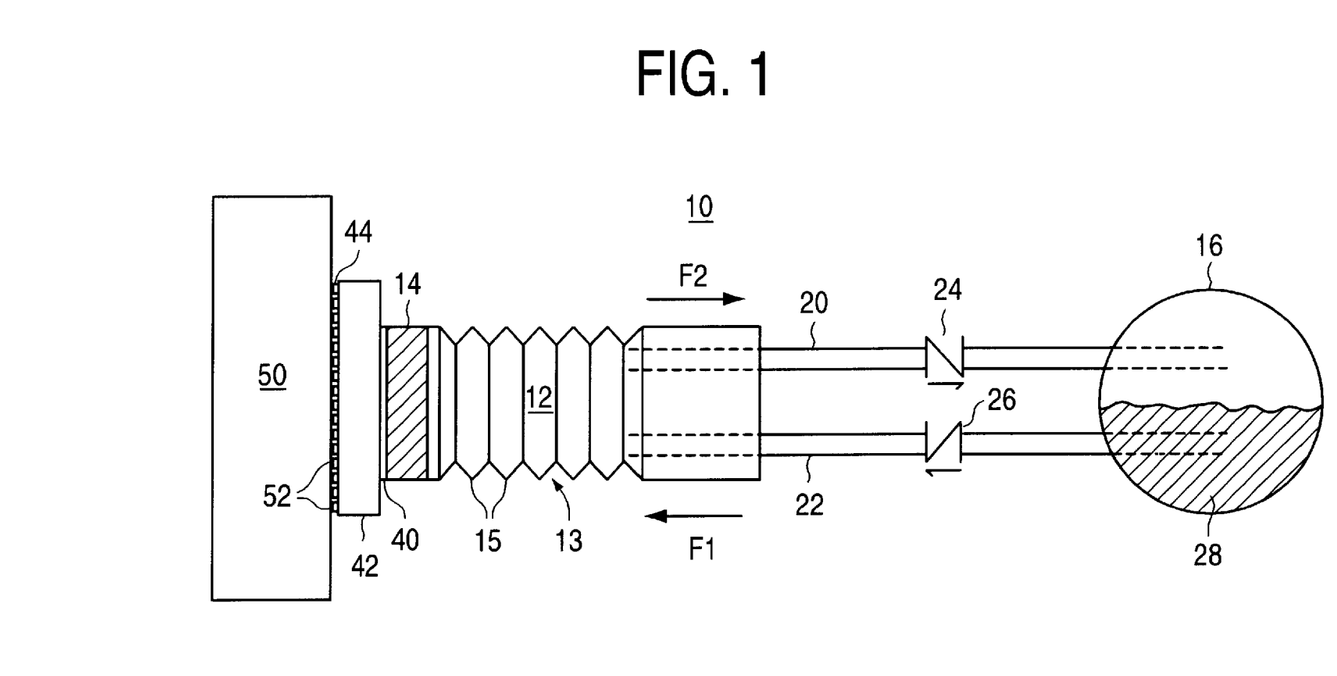
FIG. 1 illustrates a side view of one embodiment of the present invention wherein the temperature control apparatus is engaged with the backside of an integrated circuit device residing within a LGA package.

As previously discussed, many modern semiconductor devices have evolved to a point where convection heat transfer alone is unable to provide adequate cooling to the devices during the performance and functionality test of such devices. In one embodiment of the present invention (See FIG. 1), a cooling apparatus 10 comprising a bellows 12, heat slug 14, and reservoir 16 is provided. Supply and return lines 20 and 22 containing check valves 24 and 26, respectively, are provided to facilitate the transfer of a heat transfer medium (fluid) 28 between bellows 12 and reservoir 16. Bellows 12 includes a plurality of fins 15 that extend along at least a portion of the bellow's length. In FIG. 1, cooling apparatus 10 is shown contacting the backside of an integrated circuit (die) 40 that is housed within a LGA package 42. Testing of the integrated circuit 40 is achieved by placing the LGA contact lands 44 in electrical contact with a corresponding array of pogo pins or contacts 52 formed along the surface of a load board or contactor 50 of a testing apparatus. Once electrical contact with contactor 50 and LGA 42 is achieved, integrated circuit 40 may be tested in accordance with any of a number of testing methods and sequences. In any event, testing typically involves the coupling of circuit 40 to a voltage source and some mode of circuit operation. This, in turn, results in the generation of heat which must be dissipated from the integrated circuit device in order to conform to applicable test requirements and/or to maintain the temperature of the device within safe operating limits.

With continuing reference to FIG. 1, heat is transferred from device 40 by engaging the flat surface of heat slug 14 with the backside of device 40 and applying a force, $F_1$, to bellows 12. In some instances, heat slug 14 may engage the surface of another heat slug (not shown) that is attached to the backside of the die. The compliant nature of bellows 12 provides the cooling apparatus with a self-planarizing feature. This feature enhances the heat transfer capability of cooling apparatus 10 by maximizing the contact surface area between heat slug 14 and integrated circuit 40. By maximizing the contact surface area between heat slug 14 and device 40, it is appreciated that the conductive heat transfer between the two components is also maximized. When force, $F_1$, is applied to bellows 12, the bellows is compressed causing a portion of the heat transfer fluid 28 residing within the internal cavity of the bellows to flow out of the bellows cavity and into reservoir 16 via tubing 20 and check valve 24. Contact between heat slug 12 and device 40 is maintained during the testing of the integrated circuit. Heat generated during the testing of integrated circuit 40 is transferred from the backside of device 40 via a serial conduction path that runs through heat slug 14 to heat transfer fluid 28. The amount of heat that may be effectively removed from the integrated circuit 40 during test is primarily a function of the thermal capacitance of heat slug 12, the thermal capacitance of heat transfer fluid 28, and the rate of convection heat transfer from the external surface of bellows 12. The finned external surface 13 of bellows 12 provides a large surface area that enhances the convection heat transfer capability of the cooling system.

Figure 4:
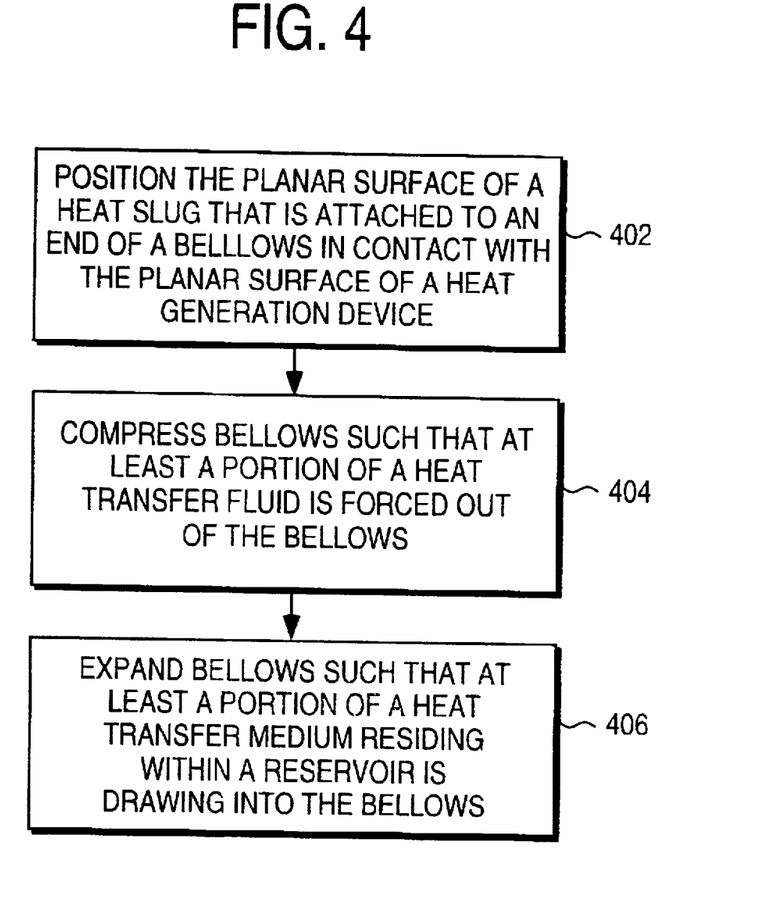
FIG. 4 is a flow diagram of one embodiment of the present invention.

When the testing of integrated circuit device 40 is complete, a second force, $F_2$, is applied to bellows 12 that causes the bellows to expand from its compressed position so as to release package 42 from contactor 50. As the bellows expands, it draws a volume of relatively cool heat transfer fluid 28 from reservoir 16 into the bellows cavity via tubing 22 and check valve 26. The influx of cool fluid into the bellows reduces the fluid temperature within the bellows cavity. The cooling apparatus 10 is then ready to engage and cool the surface of another integrated circuit device. A flow diagram of the aforementioned process is illustrated in steps 402, 404 and 406 of FIG. 4.

Figure 2:
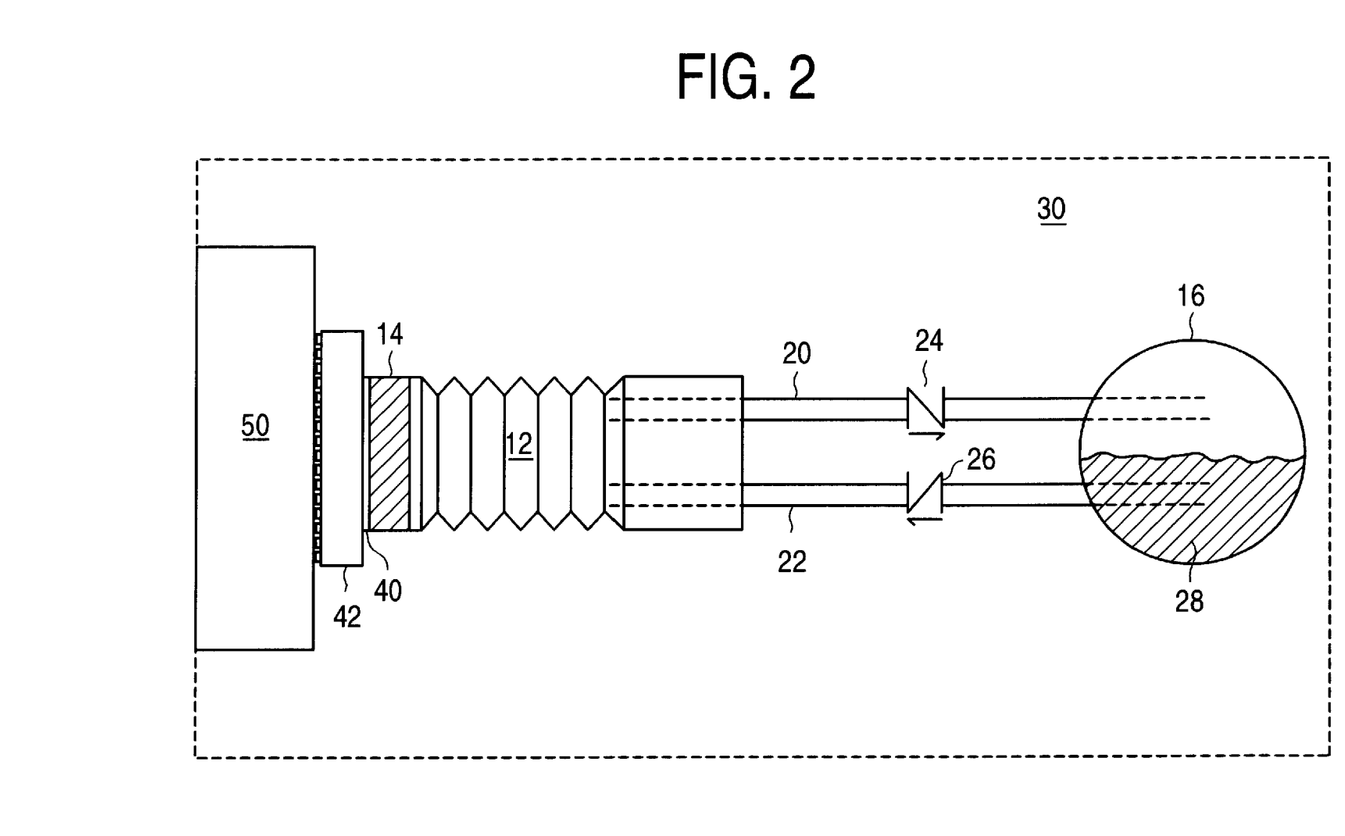
FIG. 2 shows the cooling apparatus of FIG. 1 fully enclosed within an environmental chamber.

In one embodiment of the present invention, cooling apparatus 10 is fully contained within a temperature controlled environmental chamber 30 as illustrated in FIG. 2. As previously discussed, it is desirable to hold the temperature of the integrated circuit at a relatively constant temperature while testing the device to determine its operating frequency. By containing the integrated circuit 40 and cooling apparatus 10 completely within a constant temperature environmental chamber 30, isothermal, or near isothermal, conditions are achievable.

In the implementation of the present invention a multitude of bellows designs may be used. It is important, however, that bellows 12 be designed such that the displacement of a heat transfer fluid into and out of the bellows is sufficient to provide the necessary cooling of integrated circuit 40. In addition, the spring rate of the bellows should provide a sufficient force (approximately 5 lbs) to ensure good thermal contact between die 40 and heat slug 14 when the bellows is in a compressed position. In one embodiment of the invention, bellows 12 comprises a nickel bellows having a wall thickness of 0.0025 inches. Other materials, such as copper, may also be used in the construction of bellows 12. The bellows has a length of 0.75 inches with approximately 24 fins/convolutions along its length. The inner cavity diameter and outer fin diameter of the bellows is 0.36 and 0.50 inches, respectively. It is appreciated by those skilled in the art that any change in the material, dimensions, fin pitch, etc., of the bellows will affect the spring rate and cooling capability of the bellows. Therefore, one or all of these characteristics may be altered in order to achieve a desired result.

Heat slug 14 comprises a metal having a high conduction heat transfer coefficient, such as, for example, pure copper. The heat slug has a thickness of approximately 0.030 inches and may contain a nickel plating along its mating surface for wear resistance. Thinner or thicker heat slugs may be used. The heat transfer surface of heat slug 14 may comprise any of a number of shapes, e.g., circular, rectangular, etc., and is preferably sized to match the surface dimensions of integrated circuit device 40. Heat slug 14 may be attached to bellows 12 by a variety of methods including soldering, electron beam welding, or by the use of a highly conductive adhesive. Heat slug 14 may also be integrally formed with bellows 12.

Thermal reservoir 16 comprises a stainless steel material. The volume of reservoir 16 will vary depending upon the specific heat removal requirements of the system. The volume of the reservoir also depends upon the particular reservoir design. For example, in a cooling system having a reservoir that possesses a high heat transfer area per unit volume (e.g., a long, finned containment), a smaller volume of heat transfer fluid is required. In the embodiment of FIGS. 1 and 2, a spherical reservoir is shown. Note, however, that the present invention is not limited by the geometric shape of the reservoir. In one embodiment, reservoir 16 has a volume of about 2 liters and is partially filled with about 1 liter of heat transfer fluid 28. Reservoir 16 is typically vented to atmosphere and may contain fins to enhance the cooling of fluid 28. The heat transfer fluid 28 may comprise any of a number of working fluids. For instance, fluid 28 may include fluorinert or a thermal oil.

Supply and return lines 20 and 22 may comprise ⅛ inch stainless tubing. In some applications, it may be necessary to use flexible tubing or incorporate expansion joints into the supply and return lines to accommodate the movement of bellows 12. Check valves 24 and 26 are provided within tubing 20 and 22, respectively. The check valves are used to control the flow of heat transfer fluid 28 through the cooling apparatus.

Figure 3:
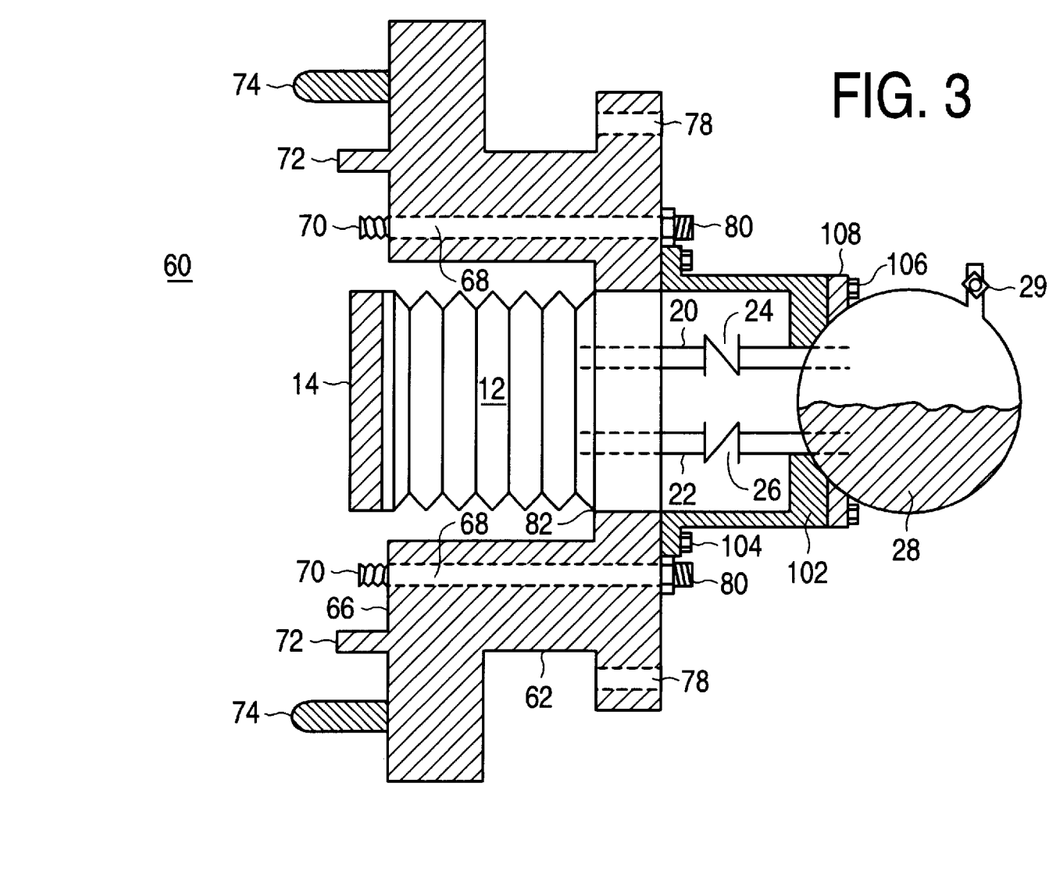
FIG. 3 illustrates the temperature control apparatus of FIG. 1 attached to a pick-up chuck.

As discussed above, the testing of an integrated circuit may be performed within an enclosed chamber. The electrical testing of an integrated circuit within the chamber ordinarily involves the use of pick and place units that are used to pick up an integrated circuit at one location and transport the device to a second location. FIG. 3 illustrates a partial side view of a vacuum pick-up chuck assembly 60 in one embodiment of the invention that is attachable to a conventional pick and place unit. Referring to FIG. 3, vacuum chuck 10 is illustrated having a main body 62. Attached to chuck assembly 60 is the cooling apparatus 10 which is depicted in FIG. 1 and described above. In one embodiment, a plurality of axially retractable vacuum cups 70 are provided along a planar surface 66 of body 62. Preferably, vacuum cups 70 are formed of a resilient material, and may include a bellows portion which facilitates the retraction. Vacuum ports 68 are formed within body 62 and are coupled in use to an exterior vacuum source via fittings 80. When the upper flat surface of a LGA package is placed into close proximity with vacuum cups 70, the exterior vacuum source will evacuate air from the package surface and cause a negative pressure upon the package to be exerted thereby serving to hold the package onto the chuck 60. The negative pressure exerted upon the package is sufficient to collapse vacuum cups 70 drawing the package toward the planar surface 66 of body 62. A nesting area, that is defined by raised lip sections 72, is provided to maintain a proper alignment of the integrated circuit package within the chuck. Pins 74 projecting from the surface of the chuck are used for aligning and being inserted within corresponding apertures within a tester. A through opening 82 is provided within body 62 to accommodate the cooling apparatus bellows 12. Bellows 12 may be secured to body 62 by weld that extends along the periphery of through opening 82. In addition, bellows 12 may include flanged sections that could facilitate the clamping or bolting of the bellows to the chuck body. A flange 108 is generally welded to the external surface of reservoir 16 to accommodate the attachment of the reservoir to chuck 60. Heat transfer fluid reservoir 16 is secured to frame 102 by means of bolted fasteners 106 at flange 108. A vent valve 29 is provided to equalize the internal reservoir pressure with that of the external environment. It is understood that reservoir 16 need not be physically attached to chuck assembly 60, but may in fact reside at some other location. In such a case, flexible tubing is required to connect bellows 12 with reservoir 16. It is preferable, however, to attach reservoir 16 to chuck assembly 60. In this manner, those problems associated with routing and coupling a fixed device to a moving one are obviated.

Supply and return lines 22 and 20 couple bellows 12 to reservoir 16. The tubing may comprise rigid tubing, flexible tubing, or a combination thereof. Threaded and welded fittings, or other well known coupling devices, may be used to connect tubing 20 and 22 to bellows 12 and reservoir 16. In some instances, expandable boots may also be desired. Check valves 24 and 26 generally comprise small precision check valves. The valves may be integrated within tubing sections 20 and 22 with the use of standard swaged, threaded or welded fittings.

Through holes 78 are provided within the chuck body 62 and are used to attach chuck assembly 60 to the attachment arm of a pick and place unit. The forces required to compress vacuum cups 30 and cooling apparatus bellows 12 is provided by the pick and place unit through the attachment arm(s). Preferably, the pick and place unit is capable of delivering 50 to 60 pounds pressure to the chuck assembly.

It is important to note that the implementation of the present invention is not limited to the specific vacuum chuck configuration disclosed herein. It is appreciated by those skilled in the art that the cooling apparatus of the present invention may be incorporated into an of a variety of chuck designs.

Figure 5:
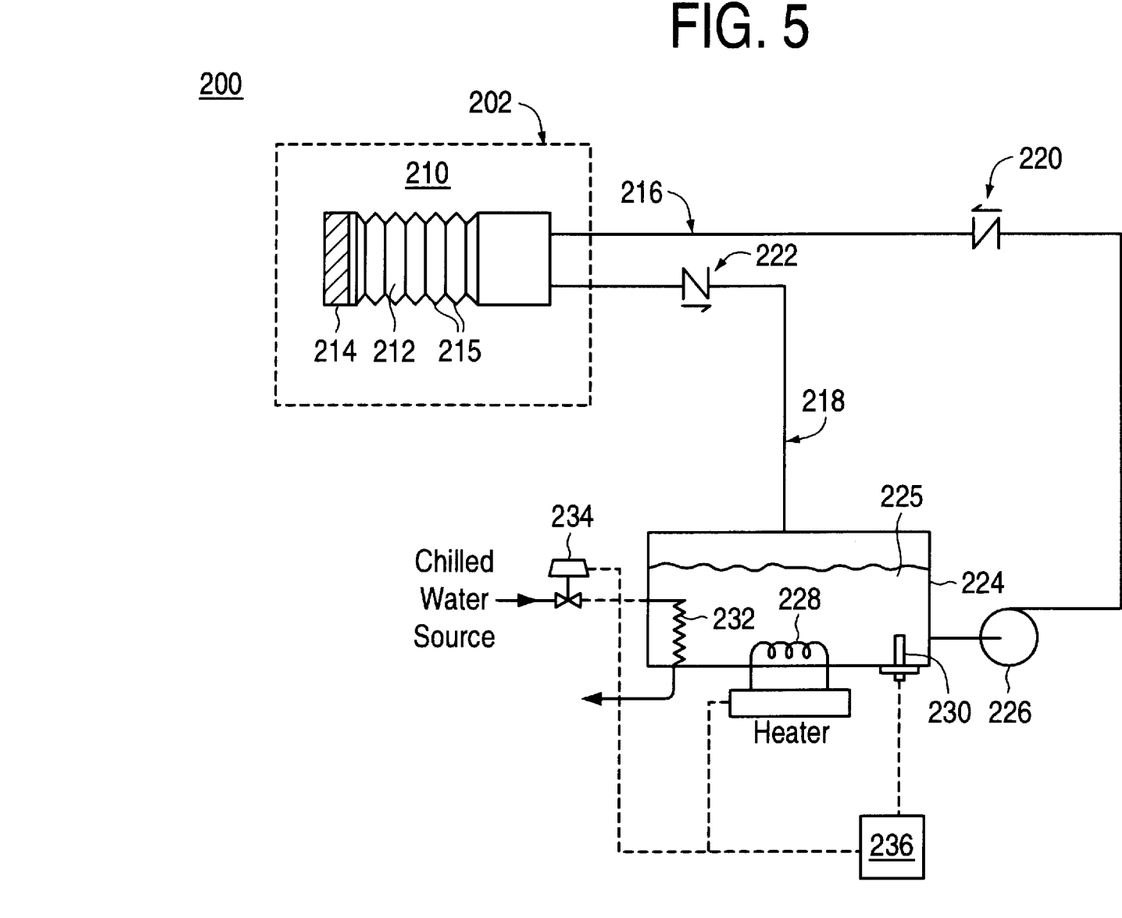
FIG. 5 illustrates another embodiment of the present invention.
Figure 6:
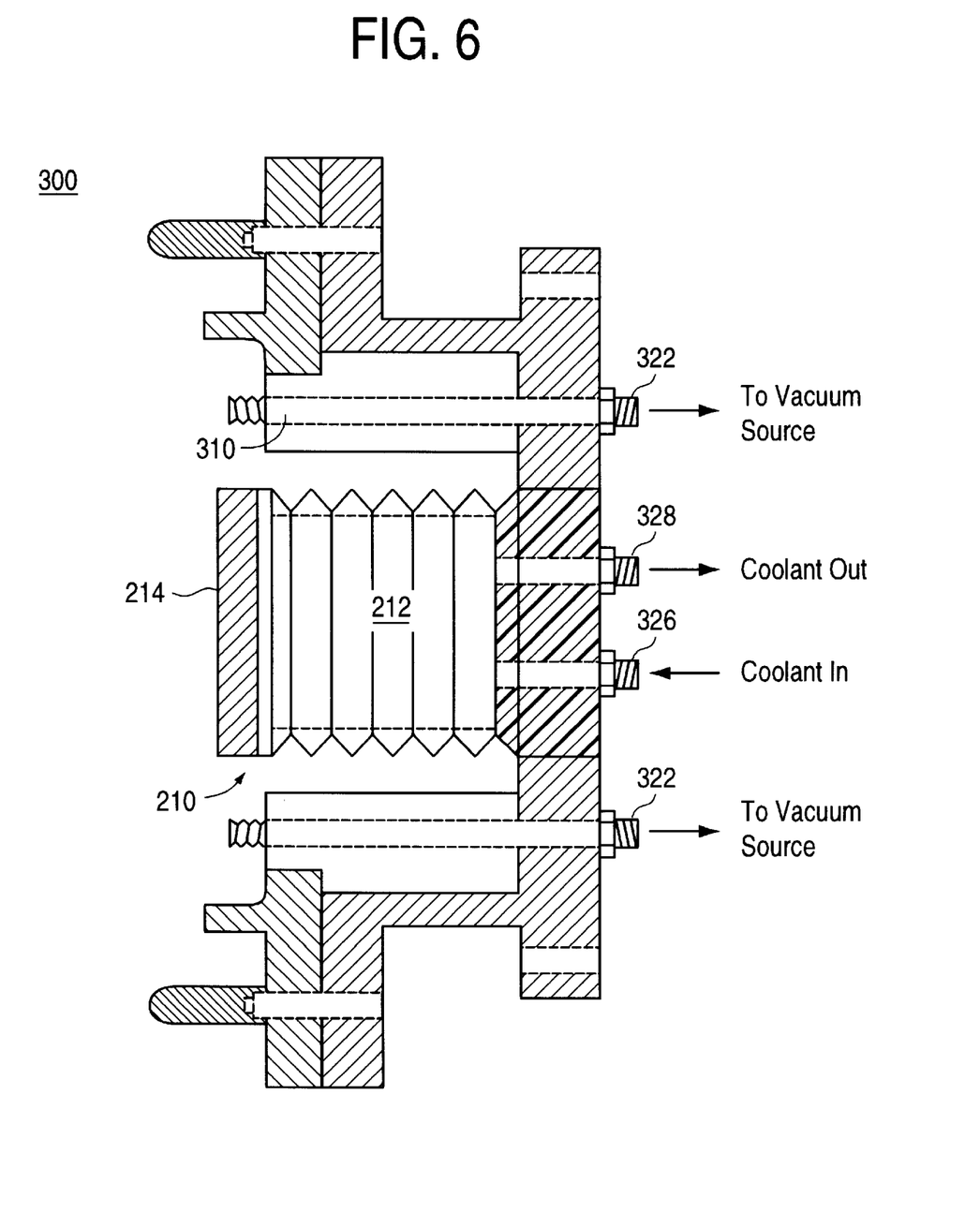
FIG. 6 illustrates a pick-up chuck apparatus that may be used in the implementation of the embodiment of FIG. 3.

In some applications, the cooling apparatus as described above, and depicted in FIGS. 1–3, will not have the heat removal capacity necessary to remove heat from high heat dissipating components. In such instances, an external cooling source and fluid pumping means is necessary. FIG. 5 illustrates a cooling system 200 that includes a bellows assembly 210 pursuant to the present invention. Cooling system 200 includes a heat transfer fluid reservoir 224, pump 226, and bellows assembly 210. Tubing sections 216 and 218 provide the fluid interconnection between the various system components. Check valves 220 and 222 are provided within tubing sections 216 and 218, respectively, to control the direction of flow through the system. Bellows assembly 210 includes a bellows 212 having a plurality of fins 215 that extend along at least a portion of the bellow's length. A heat slug 214 is attached to an end of bellows 212. The bellows assembly 210 functions in the same manner described above in conjunction with the embodiment of FIG. 1. In one embodiment, the bellows assembly is contained within a test chamber 202. Bellows assembly 210 may be attached to a chuck assembly 300 as illustrated in FIG. 6. Fittings 326 and 328 provide the means for interconnecting flexible tubing to bellows 212. Fittings 322 are used to connect the vacuum port 310 of chuck 300 with an external vacuum source.

In one embodiment, a chilled water source is connected to internal tubing 232 through a control valve 234 to provide cooling to heat transfer fluid 225. If necessary, a heating element 228 may also be provided within reservoir 224 to heat the heat transfer fluid. Temperature of the device under test is controlled by regulating the temperature of heat transfer fluid 225 in reservoir 224. A controller 236 receives an input from a temperature sensing device 230 that monitors the temperature of the fluid within reservoir 224. The controller, in turn, generates an output signal to either control valve 234 or heater 228 in order to maintain the heat transfer fluid temperature within a predetermined range. In one embodiment, the temperature of heat transfer fluid 225 is controlled to 100 degrees celsius, minus 0 degrees, plus 0 to 5 degrees celsius.

Figure 8:
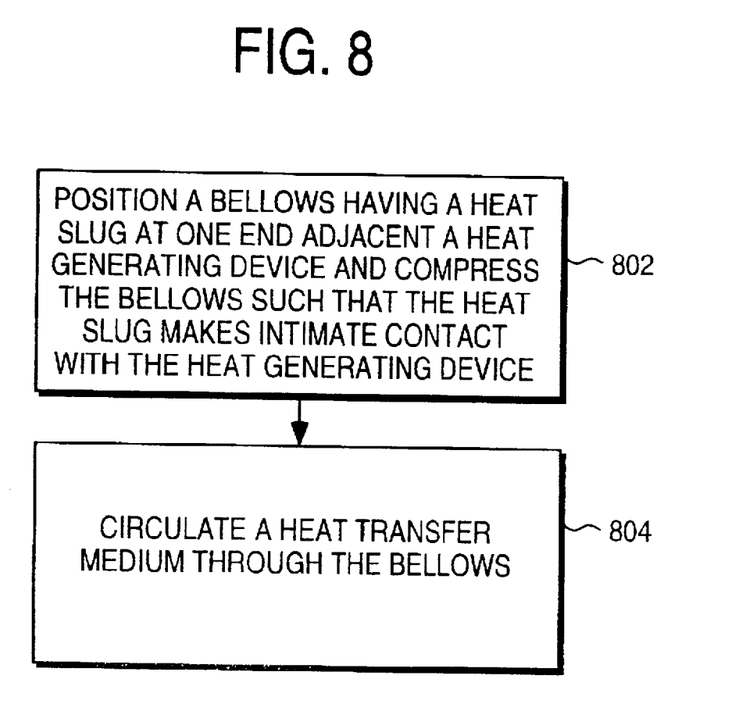
FIG. 8 is a flow diagram of one embodiment of the present invention.

Reservoir 224 comprises a stainless steel material. The volume of reservoir 224 may vary depending upon the particular heat removal requirements. Typically, the volume of reservoir 224 will vary between 2 to 4 liters. The amount of heat transfer fluid 225 contained within reservoir 224 should be sufficient to cover cooling coils 232 and heating element 228. The heat transfer fluid may comprises fluorinert, a thermal oil, or any of a number of other heat transfer fluids known in the art. Pump 226 circulates fluid 225 through cooling system 200 and typically comprises an electric motor driven centrifugal type pump. A positive displacement pump, such as a piston pump, may also be used. Tubing 216 and 218 typically comprise a combination of rigid and flexible tubing. The tubing external to chamber 202 generally includes rigid stainless steel tubing whereas tubing internal to chamber 202 comprises a flexible tubing. The diameter of tubing sections 216 and 218 may vary depending upon the fluid flow requirements. In a typical embodiment, the flow rate through the system is approximately 1 to 10 liters per hour. In such an embodiment, standard ⅛ inch tubing may be used. A flow diagram of the aforementioned process is illustrated in steps 802 and 804 of FIG. 8.

Figure 7:
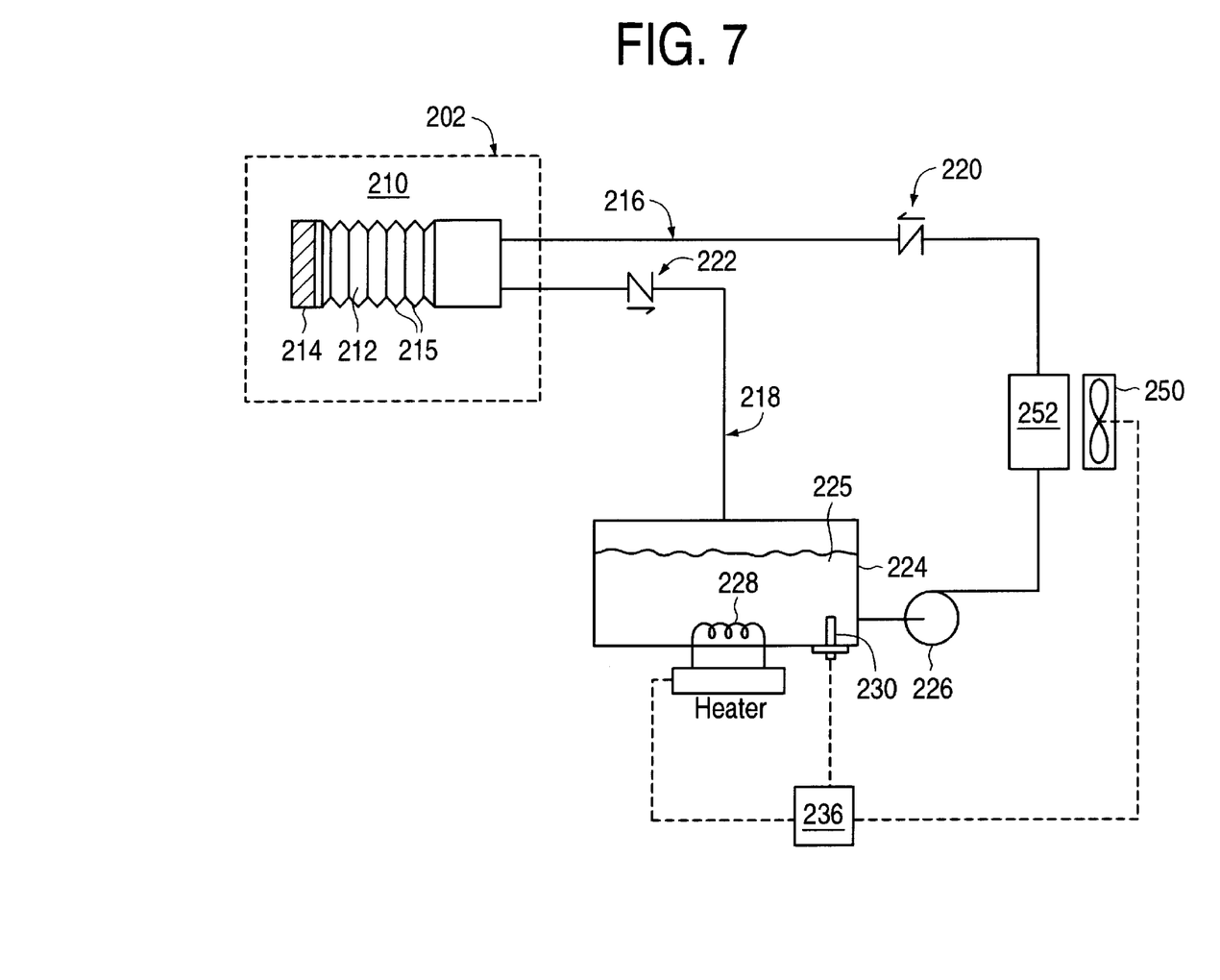
FIG. 7 illustrates yet another embodiment of the present invention.

FIG. 7 illustrates another embodiment of the invention wherein a fan 250 and radiator 252 are used to cool heat transfer fluid 225. The cooling system of FIG. 7 may be used in those applications that do not require precise or rapid temperature control.

Thus, an improved apparatus and method for controlling the temperature of an integrated circuit or other heat generating device is described. Although many alternations and modifications to the present invention will no doubt become apparent to the person of ordinary skill in the art after having read the foregoing description, it is to be understood that the particular embodiments shown and described by way of illustration are in no way intended to be limiting. It is further understood that the relative dimensions, geometric shapes, materials and process parameters set forth within the specification are exemplary of the disclosed embodiments only. Other embodiments may utilize different dimensions, shapes, materials, and process steps, etc., to achieve substantially the same results. It is also important to note that the present invention is not limited to the testing of integrated circuits housed within LGA packages. The invention may be used to test die housed within BGA, PGA, and other integrated circuit packages. Moreover, it is appreciated that the present invention may be used to cool other electronic or electrical devices.

What is claimed is:

1. An apparatus for cooling the surface of a heat generating device comprising:
 a bellows defining a cavity;
 a heat slug disposed at an end of said bellows, said heat slug having a first surface for making contact with said surface of said heat generating device;
 a reservoir for containing a heat transfer medium;
 a first conduit for permitting the flow of said heat transfer medium from said reservoir to said bellows cavity, expansion of said bellows causing at least a portion of said heat transfer medium to flow from said reservoir to said bellows cavity; and
 a second conduit for permitting the flow of said heat transfer medium from said bellows cavity to said reservoir, compression of said bellows causing at least a portion of said heat transfer medium to flow from said bellows cavity to said reservoir.

2. The apparatus of claim 1 wherein said first conduit includes a first tubing containing a first check valve that only permits a flow of said heat transfer medium from said reservoir to said bellows cavity.

3. The apparatus of claim 1 wherein said second conduit includes a second tubing containing a second check valve that only permits a flow of said heat transfer medium from said bellows cavity to said reservoir.

4. The apparatus of claim 1 wherein said heat transfer medium is in fluid contact with said heat slug.

5. The apparatus of claim 1 wherein said bellows is attached to a pick-up chuck.

6. The apparatus of claim 1 wherein said bellows and said reservoir are attached to a pick-up chuck.

7. A cooling system for transferring heat from a first surface of a semiconductor device comprising:
 a bellows defining a cavity, said bellows having an outlet opening discharging a heat transfer medium from said cavity when said bellows is compressed, said bellows further comprising an inlet opening receiving said heat transfer medium when said bellows is expanded;
 a heat slug disposed at an end of said bellows, said heat slug having a planar surface for making contact with said first surface of said semiconductor device;
 a heat transfer medium reservoir;
 a first conduit for transporting said heat transfer medium from said reservoir to said bellows inlet opening;
 second conduit for transporting said heat transfer medium from said bellows outlet opening to said reservoir;
 a first valve disposed within said first conduit that permits only the flow of said heat transfer medium from said reservoir to said bellows cavity; and
 a second valve disposed within said second conduit that permits only the flow of said heat transfer medium from said bellows cavity to said reservoir.

8. The cooling system of claim 7 wherein said first and second valves comprise check valves.

9. The cooling system of claim 7 wherein said first and second conduits comprise stainless steel tubing.

10. The cooling system of claim 7 wherein said heat transfer medium is in fluid contact with said heat slug.

11. The cooling system of claim 7 wherein said heat transfer medium comprises a liquid.

12. The cooling system of claim 7 wherein said bellows is attached to a pick-up chuck.

13. The cooling system of claim 7 wherein said bellows and said reservoir are attached to a pick-up chuck.

14. A method for transferring heat from the surface of a heat generating device, said method comprising the steps of:
 applying a first force to a bellows having a planar surface disposed at one end such that said planar surface makes intimate contact with said surface of said heat generating device and wherein said bellows is compressed such that at least a portion of a heat transfer medium residing in said bellows is forced out of said bellows into a heat transfer medium reservoir; and
 applying a second force to said bellows such that said planar surface is removed from said surface of said heat generating device and wherein said bellows expands such that at least a portion of said heat transfer medium residing in said reservoir is drawn into said bellows.

15. The method of claim 14 wherein said bellows is attached to a pick-up chuck.

16. The method of claim 14 wherein said bellows and said reservoir are attached to a pick-up chuck.

17. The method of claim 14 wherein said first pressure is applied by said pick-up chuck.

18. The method of claim 16 wherein said first pressure is applied by said pick-up chuck.

19. A method for transferring heat from the backside of a semiconductor die, said method comprising the steps of:

applying a first force to a bellows having a heat slug disposed at one end such that said heat slug makes intimate contact with said backside of said die and wherein said bellows is compressed such that at least a portion of a heat transfer medium residing in said bellows is forced out of said bellows; and applying a second force to said bellows such that said heat slug is removed from said backside of said die and wherein said bellows expands causing said heat transfer medium to flow into said bellows.

20. The method of claim 19 wherein said bellows is attached to a pick-up chuck.

21. The method of claim 19 wherein said bellows and said reservoir are attached to a pick-up chuck.

22. The method of claim 20 wherein said first pressure is applied by said pick-up chuck.

23. The method of claim 21 wherein said first pressure is applied by said pick-up chuck.

24. A method for transferring heat from a semiconductor die, said method comprising the steps of:

applying a first force to a bellows having a first heat slug disposed at one end such that said heat slug makes intimate contact with a second heat slug that is coupled to said die and wherein said bellows is compressed such that at least a portion of a heat transfer medium residing in said bellows is forced out of said bellows; and applying a second force to said bellows such that said first heat slug is removed from said second heat slug and wherein said bellows expands causing said heat transfer medium to flow into said bellows.

25. The method of claim 24 wherein said bellows is attached to a pick-up chuck.

26. The method of claim 24 wherein said bellows and said reservoir are attached to a pick-up chuck.

27. The method of claim 25 wherein said first pressure is applied by said pick-up chuck.

28. The method of claim 26 wherein said first pressure is applied by said pick-up chuck.

29. An apparatus for cooling a surface of a heat generating device comprising:

a pickup chuck;

a bellows on said pickup chuck, said bellows defining a cavity;

a heat slug disposed at an end of said bellows, said heat slug having a first surface for making contact with said surface of said heat generating device;

a reservoir for containing a heat transfer medium;

a first conduit for permitting the flow of said heat transfer medium from said reservoir to said bellows cavity; and a second conduit for permitting the flow of said heat transfer medium from said bellows cavity to said reservoir.

* * * * *

UNITED STATES PATENT AND TRADEMARK OFFICE
CERTIFICATE OF CORRECTION

PATENT NO.    : 5,847,366  Page 1 of 1
DATED         : December 8, 1998
INVENTOR(S)   : David R. Grunfield It is certified that error appears in the above-identified patent and that said Letters Patent is hereby corrected as shown below:

Column 3,
Line 66, delete "12" and insert -- 14 --.

Column 6,
Line 1, delete "22" and insert -- 20 --.
Line 1, delete "20" and insert -- 22 --.
Line 14, delete "30" and insert -- 70 --.
Line 22, delete "an of".

Column 7,
Line 47, after "device" insert -- , said apparatus --.
Line 48, after "cavity" insert -- , said bellows being movably supported so that said bellows of being repeatedly compressed and expanded during operation of said apparatus --.

Column 10,
Line 13, after "device" insert -- , said apparatus --.
Line 14, after "cavity" insert -- , said bellows being movably supported so that said bellows of being repeatedly compressed and expanded during operation of said apparatus --.

Signed and Sealed this

Ninth Day of September, 2003

JAMES E. ROGAN
*Director of the United States Patent and Trademark Office*